(12) United States Patent
Sinn et al.

(10) Patent No.: US 11,955,953 B2
(45) Date of Patent: Apr. 9, 2024

(54) PROTECTION DEVICE AND CONTROL CIRCUIT FOR A SEMICONDUCTOR SWITCH AND METHOD FOR CONTROLLING A SEMICONDUCTOR SWITCH

(71) Applicant: Robert Bosch GmbH, Stuttgart (DE)

(72) Inventors: Peter Sinn, Untergruppenbach (DE); Tim Bruckhaus, Asperg (DE); Tobias Richter, Bietigheim-Bissingen (DE)

(73) Assignee: Robert Bosch GmbH, Stuttgart (DE)

( * ) Notice: Subject to any disclaimer, the term of this patent is extended or adjusted under 35 U.S.C. 154(b) by 120 days.

(21) Appl. No.: 17/606,902

(22) PCT Filed: Apr. 29, 2020

(86) PCT No.: PCT/EP2020/061902
§ 371 (c)(1),
(2) Date: Oct. 27, 2021

(87) PCT Pub. No.: WO2020/225055
PCT Pub. Date: Nov. 12, 2020

(65) Prior Publication Data
US 2022/0216862 A1    Jul. 7, 2022

(30) Foreign Application Priority Data
May 9, 2019    (DE) ............. 10 2019 206 688.7

(51) Int. Cl.
*H03K 17/081*    (2006.01)
(52) U.S. Cl.
CPC ............... *H03K 17/081* (2013.01)

(58) Field of Classification Search
CPC ............ H03K 17/08; H03K 17/081; H03K 17/08104–08116; H03K 17/082; H03K 17/0822–0828; H03K 17/16; H03K 17/161; H03K 17/162; H03K 17/165; H03K 17/168; H02H 3/20; H02H 3/202;
(Continued)

(56) References Cited

U.S. PATENT DOCUMENTS 5,465,190 A * 11/1995 Meunier ............... H02H 3/025
361/111
2012/0200320 A1* 8/2012 Thalheim ........... H03K 17/0828
327/109

(Continued)

FOREIGN PATENT DOCUMENTS

DE    102013202641 A1    8/2014
EP    0730331 A2    9/1996
GB    2448759 A    10/2008

OTHER PUBLICATIONS

Translation of International Search Report for Application No. PCT/EP2020/061902 dated Jul. 13, 2020 (2 pages).

*Primary Examiner* — Thienvu V Tran
*Assistant Examiner* — Carlos O Rivera-Perez
(74) *Attorney, Agent, or Firm* — Michael Best & Friedrich LLP

(57) ABSTRACT

The invention relates to a protection for a semi-conductor switch against over voltages. A capacitive element is provided on an inlet connection of the semi-conductor switch. The load amount, which flows into said capacitive element, is integrated in order to trigger a protection function when a threshold value is exceeded.

17 Claims, 2 Drawing Sheets

(58) Field of Classification Search
CPC .... H02H 3/22; H02M 1/32; H02M 1/34–348; H02M 1/0025
USPC ............ 361/78, 79, 86, 88–92; 363/50–58; 323/276–280
See application file for complete search history.

(56) References Cited

U.S. PATENT DOCUMENTS

| | | |
|---|---|---|
| 2015/0349632 A1 | 12/2015 | Frank et al. |
| 2019/0074827 A1 | 3/2019 | Norling et al. |
| 2020/0036182 A1* | 1/2020 | Hanson .................... H02H 3/22 |

* cited by examiner

PROTECTION DEVICE AND CONTROL CIRCUIT FOR A SEMICONDUCTOR SWITCH AND METHOD FOR CONTROLLING A SEMICONDUCTOR SWITCH

BACKGROUND OF THE INVENTION

The present invention relates to a protection device for a semiconductor switch and to a control circuit for a semiconductor switch. In addition, the present invention relates to a method for controlling a semiconductor switch. In particular, the present invention relates to the protection of a semiconductor switch from overvoltages.

The use of semiconductor switches as switching elements is gaining increasing importance. In this case, during opening of the switching elements, in particular of a semiconductor switching element, overvoltages may result across the output terminals of the semiconductor switch owing to leakage inductances or the like. In order to avoid any damage to the semiconductor switch as a result of such overvoltages, suitable overvoltage protection needs to be provided. Such overvoltage protection is known, for example, under the term "active clamping".

The document DE 10 2013 202 641 A1 discloses overvoltage protection for a semiconductor switch having a steady-state component and a dynamic component. The dynamic component can respond, for example, in the case of overvoltages below the steady-state value and is temporally limited in terms of its response behavior.

Avalanche diodes can be used, for example, for the protection devices of semiconductor switches for the detection of an overvoltage. As the switching speeds of the semiconductor switches increase, in this case increasingly the capacitive properties of such avalanche diodes also need to be taken into consideration.

SUMMARY OF THE INVENTION

The present invention provides a protection device for a semiconductor switch, a control circuit for a semiconductor switch, and a method for controlling a semiconductor switch having the features of the independent patent claims. Further embodiments are the subject matter of the dependent patent claims.

Accordingly, provision is made for the following:

A protection device for a semiconductor switch having a capacitive component, an integrator and a comparison device. The integrator is designed to integrate a charging current into the capacitive component. In this way, a quantity of charge in the capacitive component can be determined from the integrated charging current. The capacitive component is in this case arranged between an input terminal of the semiconductor switch and the integrator. The comparison device is designed to control the semiconductor switch when the determined quantity of charge in the capacitive component exceeds a preset limit value.

Furthermore, provision is made for the following:

A control circuit for a semiconductor switch having a driver circuit and a protection device according to the invention for the semiconductor switch. The driver circuit is designed to receive a control signal for the semiconductor switch and to control a gate of the semiconductor switch using the received control signal. The driver circuit is in particular electrically coupled to the protection device. The driver circuit is furthermore designed to control the semiconductor switch at least partially when the quantity of charge in the capacitive component determined by the protection device exceeds the preset limit value.

Finally, provision is made for the following:

A method for controlling a semiconductor switch having the steps of integrating a charging current into a capacitive component, which is arranged between an input terminal of the semiconductor switch and an integrator. By virtue of the integration of the charging current, therefore, a quantity of charge in the capacitive component is determined. The method furthermore comprises a step for comparing the determined quantity of charge in the capacitive component with a preset limit value and controlling the semiconductor switch when the determined quantity of charge in the capacitive component exceeds the preset limit value.

Conventional overvoltage protection devices for semiconductor switching elements generally use a clamping diode, for example an avalanche diode or a Zener diode. As switching speeds increase, in this case the capacitive properties, in particular the junction capacitances of such diodes also need to be taken into consideration. Depending on the design, the capacitive properties can have a negative effect on the response voltage or the response behavior of an overvoltage protection device for the semiconductor switch.

It is therefore a concept of the present invention to take account of this knowledge and to provide a protection device for a semiconductor switch which takes into consideration, in a targeted manner, the capacitive properties of a component for detecting overvoltages. In this way, in particular even in the case of relatively high switching speeds, reliable and quick detection of overvoltages at a semiconductor switching element is possible. Correspondingly, resultant overvoltages can be identified in good time and suitable countermeasures introduced for discharging the overvoltages. For example, the semiconductor switching element can be wholly or partially closed in order to counteract a further increase in the voltage across the terminals of the semiconductor switching element. As a result, damage to the semiconductor switching element or at least premature ageing owing to overvoltages or the like can be prevented.

If the capacitance of the capacitive component is known, it is possible by virtue of integration of the electrical current into the capacitive component to determine the quantity of charge in the capacitive component. It is therefore possible to draw conclusions on the voltage at the semiconductor switching element from the relationship between the capacitance of the capacitive component and the determined quantity of charge. If the determined quantity of charge in the capacitive component exceeds a quantity of charge which corresponds to a preset tripping voltage, suitable measures can be introduced in order to counteract a further voltage increase at the semiconductor switching element or to reduce the electrical voltage across the semiconductor switching element. For example, for this purpose, the semiconductor switching element can be wholly or partially controlled or closed.

The evaluation of the quantity of charge in the capacitive component in this case enables quick and efficient detection of potential overvoltages at the semiconductor switching element, in particular at high switching speeds.

In accordance with one embodiment, the capacitive component comprises a diode. In particular, the capacitive component can comprise, for example, an avalanche diode or a Zener diode. Diodes with a defined breakdown voltage, such as, for example, avalanche or Zener diodes, make it possible to detect an overvoltage even in the case of a slow or steady-state voltage increase. At relatively high switching speeds, however, furthermore the capacitive properties, such as, for example, the junction capacitance of the diodes, also need to be taken into consideration. By virtue of the evaluation of the quantity of charge into the diode, it is already possible to detect that a critical overvoltage has been reached before the junction capacitance of the diode is charged and the diode fires. Correspondingly, both in the case of slow and in the case of quick switching operations, reliable overvoltage protection can be ensured.

In accordance with one embodiment, the preset quantity of charge can be set using a junction capacitance of the diode. For example, the junction capacitance can be determined on the basis of data in the data sheet of the corresponding diode. Furthermore, any other desired methods, in particular measurement-based methods for determining the junction capacitance of the respective diode, are of course also possible. By virtue of the consideration of the junction capacitance, the response of the protection device for protecting the semiconductor switch can be set precisely. For example, on the basis of the junction capacitance and a preset voltage threshold for the protection device, a quantity of charge at which the protection device is intended to trip can be determined, in particular calculated.

In accordance with one embodiment, the comparison device is designed to control the semiconductor switch when an electrical voltage across the diode exceeds a breakdown voltage of the diode. In particular, the breakdown voltage may be the breakdown voltage of an avalanche diode or a Zener diode in the reverse direction. In this way, the semiconductor switch is also controlled when the preset breakdown voltage of the diode in the reverse direction is exceeded, even if the determined quantity of charge has not yet reached the preset limit value at this time. As a result, the reliability of the protection function can be increased further still.

In accordance with one embodiment, the capacitive component comprises a capacitor. Capacitors are components which are simple to implement and inexpensive. By virtue of the use of capacitors, therefore, an inexpensive, simple and reliable protection device for a semiconductor switch can be realized.

In accordance with one embodiment, the integrator is designed to synchronize the integration of the charging current with a control signal for the semiconductor switch. For example, the integrator can be reset in synchronism with the control signals for the semiconductor switch. In this way, a drift of the integrator during the integration of the charging current can be avoided.

In accordance with one embodiment, the integrator is designed to restart the integration of the charging current in each case when the semiconductor switch is opened. In order to start the integration, the value of the integrator can be reset in each case. In this way, the integration of the charging current begins in each case at a defined value of zero when the semiconductor switch is opened and therefore the electrical voltage across the semiconductor switch increases.

In accordance with one embodiment, the integrator can comprise a capacitor. In particular, the integrator can consist of a capacitor or an arrangement having a plurality of capacitors. Capacitive components, in particular capacitors, enable particularly simple integration of quantities of charge. In this case, an electrical voltage present across the two terminals of the capacitor can correspond to the quantity of charge in the capacitor.

The above configurations and developments can be combined with one another as desired, where sensible. Further configurations, developments and implementations of the invention also include combinations which have not been explicitly mentioned of features of the invention described above or below with respect to the exemplary embodiments. In particular, a person skilled in the art will in this case also add individual aspects as improvements or additions to the respective basic forms of the invention.

BRIEF DESCRIPTION OF THE DRAWINGS

Further features and advantages of the present invention will be explained below with reference to the figures, in which.

DETAILED DESCRIPTION

Figure 1:
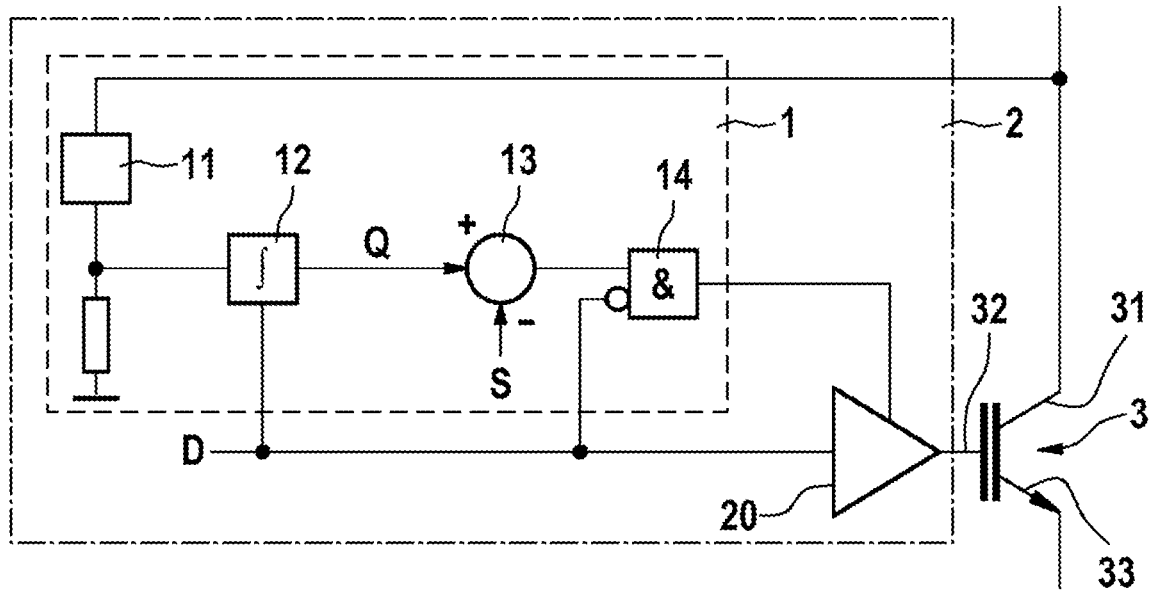
FIG. 1 shows a schematic illustration of a basic circuit diagram of a control circuit for a semiconductor switch having a protection device in accordance with one embodiment.

FIG. 1 shows a schematic illustration of a basic circuit diagram of a control circuit 2 for a semiconductor switch 3. The control circuit 2 comprises a driver circuit 20 for driving the gate 32 of the semiconductor switch 3. The driver circuit 20, for this purpose, receives a control signal D, amplifies this control signal D and, corresponding to the control signal D, controls the gate 32 of the semiconductor switch 3. In this way, the electrical connection between an input terminal 31 and an output terminal 33 of the semiconductor switch 3 can be opened or closed. For example, the semiconductor switch 3 may be a MOSFET or an insulated-gate bipolar transistor (IGBT). In principle, any other desired semiconductor switches are of course also possible. For example, the semiconductor switch 3 may be a semiconductor switch of a power stage, such as, for example, a power converter or the like. If the electrical connection between the input terminal 31 and the output terminal 33 of the semiconductor switch 3 is interrupted, this may result in a voltage increase between the input terminal 31 and the output terminal 33, for example owing to leakage inductances. If the electrical voltage between the input terminal 31 and the output terminal 33 increases beyond a permissible degree, the semiconductor switch 3 can be damaged or possibly even destroyed thereby. For protection against such overvoltages, a protection device 1 can be provided, for example.

The protection device 1 comprises a capacitive component 11, an integrator 12 and a comparison device 13. Furthermore, the protection device 1 can also comprise, for example, a logic gate 14 and possibly also further components. The capacitive component 11 is arranged between the input terminal 31 of the semiconductor switch and an input terminal of the integrator 12. If the electrical voltage at the input terminal 31 of the semiconductor switch 3 increases, the capacitive component 11 is charged via the integrator 12. The integrator 12 in this case integrates the charging current into the capacitive component. By virtue of this integration, the integrator 12 can determine a quantity of charge which is flowing into the capacitive component 11. Given a constant capacitance C of the capacitive component 11, the quantity of charge in the capacitive component 11 is therefore proportional to the electrical voltage across the capacitive component 11.

The integrator 12 outputs an output signal which is proportional to the determined quantity of charge Q in the capacitive component 11. This may be an analog or digital output signal. The determined quantity of charge Q is provided to a comparator 13 in this way. The comparator 13 compares the determined quantity of charge Q with a preset limit value S. For example, the comparator 13 may be a subtracter, which forms a difference between the determined quantity of charge Q and the preset setpoint value S. If the determined quantity of charge Q exceeds the preset setpoint value S, the gate 32 of the semiconductor switch 3 can thereupon be controlled, for example. In this way, the semiconductor switch 3 between the input terminal 31 and the output terminal 33 can be wholly or at least partially switched on. As a result, the electrical voltage between the input terminal 31 and the output terminal 33 is reduced. The control of the gate 32 of the semiconductor switch 3 can take place, for example, likewise via the driver circuit 20.

Furthermore, the control of the semiconductor switch 3, after the detection of the fact that the determined quantity of charge exceeds the setpoint value S, can additionally be linked with the control signal D. For this purpose, the result of the comparator 13 and the control signal D can be supplied to a logic gate 14. The logic gate 14 links the result of the comparator 13 and the control signal D with one another. For example, the semiconductor switch 3 can only be controlled when, corresponding to the control signal D, the semiconductor switch should not be controlled but the comparator 13 determines that the quantity of charge Q exceeds the setpoint value S. As long as the control signal D presets an active control of the semiconductor switch 3, no further influencing by the protection device 1 takes place, on the other hand.

The integrator 12 may be any desired analog or digital integrator. The integrator 12 may be implemented, for example, by means of any desired known or novel integrator circuit.

Furthermore, the integration of the integrator 12 can be synchronized with the control signal D. For example, the integration of the integrator 12 can be reset and restarted in each case when, corresponding to the control signal D, the semiconductor switch 12 is intended to be opened. In this way, for example, a drift of the integrator can be avoided. Furthermore, any other desired synchronization of the integrator 12, in particular using the control signal D, is of course also possible.

Figure 2:
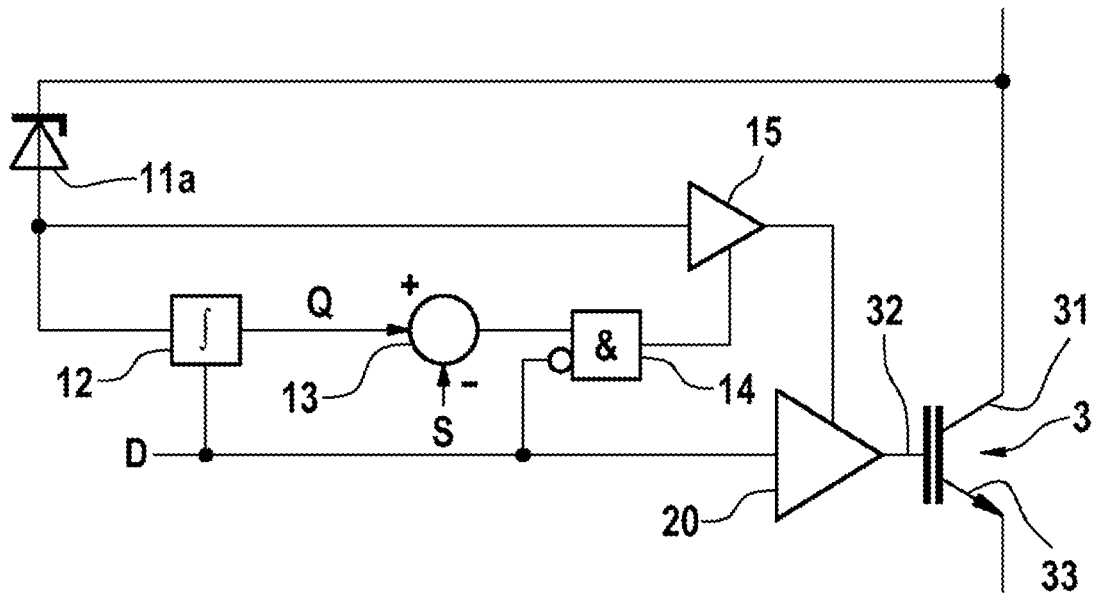
FIG. 2 shows a schematic illustration of a basic circuit diagram of a control circuit for a semiconductor switch in accordance with a further embodiment.

FIG. 2 shows a schematic illustration of a basic circuit diagram of a control circuit 2 for a semiconductor switch 3 in accordance with a further embodiment. The control circuit 2 and in particular the protection device 1 in this case largely corresponds to the previously described embodiment. The embodiment in accordance with FIG. 2 differs from the previously described embodiment in particular in that the capacitive component 11 is a diode 11a. For example, the diode 11a may be an avalanche diode or Zener diode. Such a diode 11a can have a defined breakdown voltage, at which the diode 11a is also on in the reverse direction. Before the diode transfers to the on state, however, the diode 11a also has capacitive properties. Prior to the breakdown of the diode 11a, in this case charging of the junction capacitance of the diode 11a takes place. The integrator 12 integrates the charging current into the diode 11a and correspondingly passes on the determined quantity of charge Q to the comparator 13. If it is detected that the quantity of charge Q exceeds the preset setpoint value S, the semiconductor switch 3 can be controlled, as already described above. Furthermore, control of the semiconductor switch 3 can also take place when the diode 11a transfers to an on state once the breakdown voltage has been exceeded. For this purpose, that terminal of the diode 11a which is connected to the integrator 12 is additionally also connected to a further driver stage 15, which outputs an output signal for controlling the semiconductor switch 3 after breakdown of the diode 11a. In addition, the output of the comparator 13, possibly via the above-described logic gate 14, is also connected to this further driver stage 15. In this way, in the case of quick dynamic operations, overvoltage protection can be implemented by evaluation of the quantity of charge in the diode 11a. Furthermore, even in the case of slow, possibly steady-state overvoltages, tripping of the protection device can be achieved by firing of the diode 11a.

Figure 3:
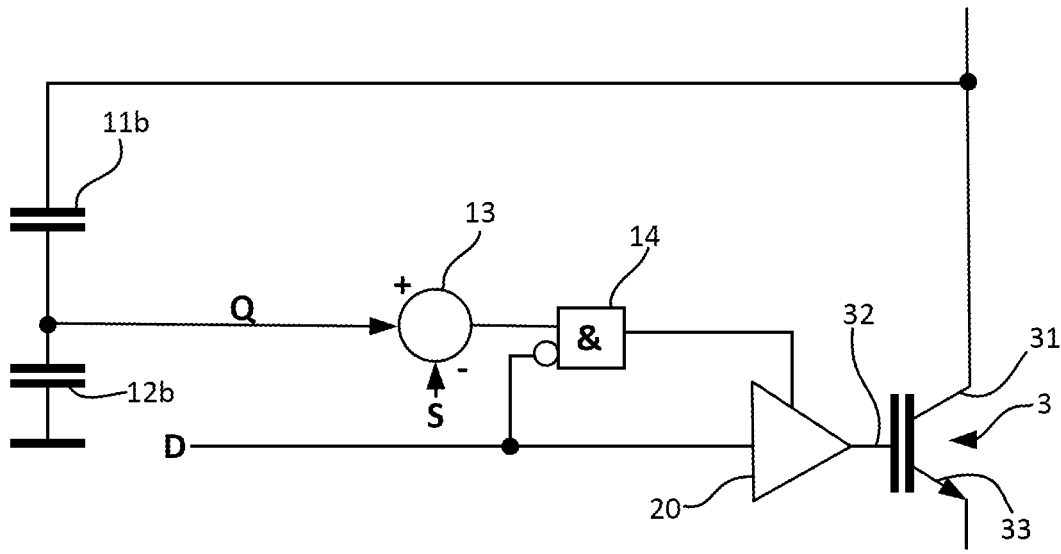
FIG. 3 shows a schematic illustration of a basic circuit diagram of a control circuit for a semiconductor switch in accordance with yet a further embodiment.

FIG. 3 shows a further embodiment of a control circuit 2 for a semiconductor switch. In this embodiment, the capacitive component 11 comprises a capacitor 11b. Correspondingly, by integration of the charging current into the capacitor 11b and comparison of the quantity of charge from the integrated charging current with a setpoint value S, overvoltage protection can be realized. If appropriate, the integrator 12 can be implemented, for example, in a simple embodiment as a capacitor 12b. Such a circuit arrangement having two capacitors 11b and 12b as capacitive component and integrator enables particularly simple and therefore inexpensive overvoltage protection for a semiconductor switch 3.

Figure 4:
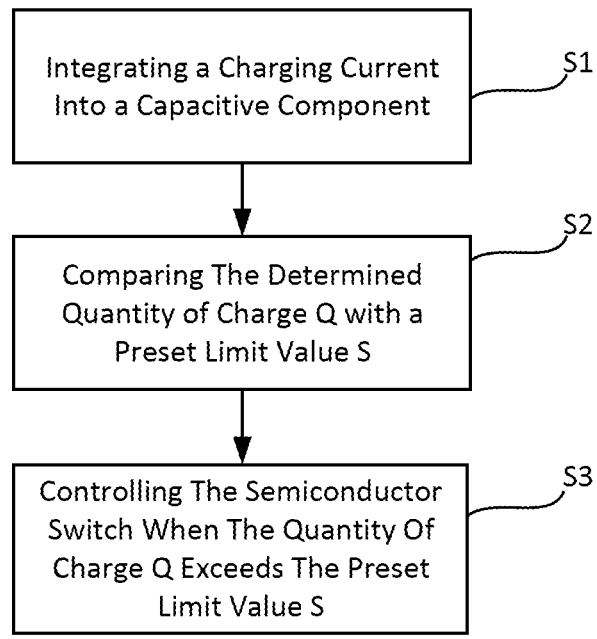
FIG. 4 shows a schematic illustration of a flowchart, on which a method for controlling a semiconductor switch in accordance with one embodiment is based.

FIG. 4 shows a schematic illustration of a flowchart, on which a method for controlling a semiconductor switch 3 in accordance with one embodiment is based. The method can comprise in principle any type of suitable method steps, as have already been described previously in connection with the protection device 1 and the control circuit 2. Furthermore, the protection device 1 and the control circuit 2 can also comprise any desired suitable components in order to implement the method steps described below.

The method comprises a step S1 for integrating a charging current into a capacitive component 11. The capacitive component can be arranged between an input terminal 31 of the semiconductor switch 3 and an integrator 12. In this way, a quantity of charge Q in the capacitive component 11 can be determined from the integrated charging current. In addition, the method comprises a step S2 for comparing the determined quantity of charge Q in the capacitive component with a preset limit value S. Finally, the method comprises a step S3 for controlling the semiconductor switch 3 when the determined quantity of charge Q in the capacitive component 11 exceeds the preset limit value S.

In particular, the integration of the charging current can be synchronized with a control signal D for the semiconductor switch 3. For example, the integration of the charging current can be reset and started when the semiconductor switch 3 is closed.

By way of summary, the present invention relates to protection for a semiconductor switch from overvoltages. For this purpose, a capacitive component is provided at an input terminal of the semiconductor switch. The quantity of charge which flows into this capacitive component is integrated in order to trip a protection function when a limit value is exceeded.

The invention claimed is:

1. A protection device (1) for a semiconductor switch (3) comprising:
   a capacitive component (11, 11a, 11b);

an integrator (12, 12b) configured to integrate a charging current into the capacitive component (11, 11a, 11b) in order to determine a quantity of charge (Q) in the capacitive component (11, 11a, 11b) from the integrated charging current;

a comparison device (13) configured to control the semiconductor switch (3) when the determined quantity of charge (Q) in the capacitive component (11, 11a, 11b) exceeds a preset limit value (S); and a logic gate (14) for linking the result of the comparison device (13) and a control signal (D), wherein the capacitive component (11, 11a, 11b) is arranged between an input terminal (31) of the semiconductor switch (3) and the integrator (12, 12b), and wherein the integrator (12, 12b) is configured to synchronize the integration of the charging current with the control signal (D) for the semiconductor switch (3).

2. The protection device (1) as claimed in claim 1, wherein the capacitive component (11, 11a, 11b) comprises an avalanche diode.

3. The protection device (1) as claimed in claim 2, wherein the preset limit value (S) is set using a junction capacitance of the avalanche diode (11a).

4. The protection device (1) as claimed in claim 2, wherein the comparison device (13) is configured to control the semiconductor switch (3) when an electrical voltage across the diode (11a) exceeds a breakdown voltage of the avalanche diode (11a).

5. The protection device (1) as claimed in claim 1, wherein the capacitive component (11, 11a, 11b) comprises a capacitor (11b).

6. The protection device (1) as claimed in claim 1, wherein the integrator (12, 12b) is designed to start the integration of the charging current when the semiconductor switch (13) is opened.

7. The protection device (1) as claimed in claim 1, wherein the integrator (12b) comprises a capacitor.

8. A control circuit (2) for a semiconductor switch (3) comprising:
    a driver circuit (20) configured to receive the control signal (D) for the semiconductor switch (3) and to control a gate (32) of the semiconductor switch (3) using the received control signal (D); and
    a protection device (1) as claimed in claim 1,
    wherein the driver circuit (20) is electrically coupled to the protection device (1), and the driver circuit (20) is configured to control the semiconductor switch (3) at least partially when the quantity of charge (Q) in the capacitive component (11, 11a, 11b) determined by the protection device (1) exceeds the preset limit value (S).

9. The protection device (1) as claimed in claim 1, wherein the capacitive component (11, 11a, 11b) comprises a zener diode.

10. A method for controlling a semiconductor switch (3) comprising:
    integrating (S1) a charging current into a capacitive component (11, 11a, 11b) to determine a quantity of charge (Q) in the capacitive component (11, 11a, 11b) from the integrated charging current, wherein the capacitive component is arranged between an input terminal (31) of the semiconductor switch (3) and an integrator (12, 12b);

comparing (S2) the determined quantity of charge (Q) in the capacitive component (11, 11a, 11b) with a preset limit value (S);

controlling (S3) the semiconductor switch (3) when the determined quantity of charge (Q) in the capacitive component (11, 11a, 11b) exceeds the preset limit value (S);

linking the result of a comparison device (13) and a control signal (D) with a logic gate (14); and synchronizing the integration of the charging current with the control signal (D) for the semiconductor switch (3).

11. The method as claimed in claim 10, wherein the integration (S1) of the charging current is started when the semiconductor switch (3) is opened.

12. The method as claimed in claim 10, wherein the capacitive component (11, 11a, 11b) is arranged between an input terminal (31) of the semiconductor switch (3) and the integrator (12, 12b).

13. The method as claimed in claim 12, wherein the capacitive component (11, 11a, 11b) includes an avalanche diode.

14. The method as claimed in claim 12, wherein the capacitive component (11, 11a, 11b) includes a zener diode.

15. A control circuit (2) for a semiconductor switch (3) comprising:
    a capacitive component (11, 11a, 11b);
    an integrator (12, 12b) configured to integrate a charging current into the capacitive component (11, 11a, 11b) in order to determine a quantity of charge (Q) in the capacitive component (11, 11a, 11b) from the integrated charging current;
    a comparison device (13) configured to control the semiconductor switch (3) when the determined quantity of charge (Q) in the capacitive component (11, 11a, 11b) exceeds a preset limit value (S);
    a logic gate (14) for linking the result of the comparison device (13) and a control signal (D); and
    a driver circuit (20) configured to receive the control signal (D) for the semiconductor switch (3) and to control a gate (32) of the semiconductor switch (3) using the received control signal (D);
    wherein the driver circuit (20) is electrically coupled to a protection device (1), and the driver circuit (20) is configured to control the semiconductor switch (3) at least partially when the quantity of charge (Q) in the capacitive component (11, 11a, 11b) determined by the protection device (1) exceeds the preset limit value (S), and
    wherein the capacitive component (11, 11a, 11b) is arranged between an input terminal (31) of the semiconductor switch (3) and the integrator (12, 12b).

16. The control circuit (2) according to claim 15, wherein the capacitive component (11, 11a, 11b) includes either an avalanche diode or a Zener diode, and control of the semiconductor switch also takes place when the avalanche diode or the Zener diode transfers to an on state once a breakdown voltage has been exceeded.

17. The control circuit (2) according to claim 15, wherein the integrator (12, 12b) is configured to synchronize the integration of the charging current with the control signal (D) for the semiconductor switch (3).

* * * * *